US012635090B2

(12) United States Patent
Chen

(10) Patent No.: US 12,635,090 B2
(45) Date of Patent: May 19, 2026

(54) FAST-LOCKING STRUCTURE OF LED DISPLAY MODULE AND ITS DISASSEMBLY AND ASSEMBLY METHOD

(71) Applicant: Shenzhen Lan Display Photoelectric Co., Ltd., Shenzhen (CN)

(72) Inventor: Qundian Chen, Shenzhen (CN)

( * ) Notice: Subject to any disclaimer, the term of this patent is extended or adjusted under 35 U.S.C. 154(b) by 0 days.

(21) Appl. No.: 19/006,282

(22) Filed: Dec. 31, 2024

(65) Prior Publication Data

US 2025/0220831 A1     Jul. 3, 2025

(30) Foreign Application Priority Data

Dec. 31, 2023    (CN) ......................... 202311874052.7

(51) Int. Cl.
 *F16B 5/00*          (2006.01)
 *F16M 11/04*        (2006.01)
 *H05K 5/02*          (2006.01)
 *A47B 97/00*         (2006.01)

(52) U.S. Cl.
 CPC ......... *H05K 5/0217* (2013.01); *F16B 5/0084* (2013.01); *F16M 11/041* (2013.01); *A47B 97/001* (2013.01)

(58) Field of Classification Search
 CPC .... F16B 5/0056; F16B 5/0084; F16B 5/0664; Y10T 403/591; Y10T 403/598; Y10T 403/599; Y10T 403/602; Y10S 403/04; Y10S 403/10; E05C 1/00; E05C 1/004; E05C 1/006; E05C 1/08; E05C 1/085; E05C 1/12; E05C 1/14; E05C 1/145

USPC ................ 403/322.1, 324, 325, 327, DIG. 4, 403/DIG. 10
See application file for complete search history.

(56) References Cited

U.S. PATENT DOCUMENTS

| | | | | | |
|---|---|---|---|---|---|
| 1,257,998 | A | * | 3/1918 | Gruber ...................... | E05C 1/14 |
| | | | | | 292/170 |
| 8,453,983 | B2 | * | 6/2013 | Huang ................... | F16M 11/22 |
| | | | | | 248/222.12 |
| 9,631,654 | B2 | * | 4/2017 | Liu ........................ | F16B 5/0642 |
| 9,833,064 | B2 | * | 12/2017 | Demski ............... | B60R 11/0252 |
| 9,983,688 | B2 | * | 5/2018 | Ko .......................... | A45C 11/00 |
| 2004/0032708 | A1 | * | 2/2004 | Lo ......................... | G06F 1/1616 |
| | | | | | 361/679.58 |

(Continued)

FOREIGN PATENT DOCUMENTS

| | | | | | |
|---|---|---|---|---|---|
| CN | 104797114 | A | * | 7/2015 | ................ F16B 2/10 |
| CN | 221743569 | U | | 9/2024 | |

*Primary Examiner* — Amber R Anderson
*Assistant Examiner* — Zachary A Hall
(74) *Attorney, Agent, or Firm* — Nicholas Makridakis

(57) ABSTRACT

Disclosed in the present invention is a fast-locking structure for the LED display module and its disassembly and assembly method. The fast-locking structure comprises a locking base, a locking shaft piece and a locking piece are arranged on the locking base through a locking groove, and an unlocking shaft piece is arranged on the locking shaft piece through a matching groove; the unlocking shaft piece switches the sliding state of the locking shaft piece in the locking groove through an unlocking end and a sliding groove hole in the matching groove, one end of the locking shaft piece is connected with the driving locking piece, a locking end is arranged at one end of the unlocking shaft piece. The LED display module can be achieved front face rapid unlocking.

5 Claims, 10 Drawing Sheets

(56) References Cited

U.S. PATENT DOCUMENTS

| 2011/0128693 | A1 * | 6/2011 | Zhang | G11B 33/123 |
| | | | | 361/679.33 |
| 2011/0268497 | A1 * | 11/2011 | Liang | H04M 1/0252 |
| | | | | 403/327 |
| 2012/0087722 | A1 * | 4/2012 | Lin | H05K 5/0278 |
| | | | | 403/327 |

* cited by examiner

FAST-LOCKING STRUCTURE OF LED DISPLAY MODULE AND ITS DISASSEMBLY AND ASSEMBLY METHOD

RELATED APPLICATIONS

The present patent document claims the benefit of priority to Patent Application No. 202311874052.7, filed Dec. 31, 2023, and entitled "Fast-locking Structure of LED Display Module and Its Disassembly and Assembly Method," the entire contents of each of which are incorporated herein by reference.

BACKGROUND

1. Technical Field

The present invention relates to the field of LED display screens, and in particular to a fast-locking structure of LED display module and its disassembly and assembly method.

2. Background Information

Light emitting diode (LED) is abbreviated as LED. LED display screen is composed of many LEDs. It displays various information such as text, graphics, images, animation, market conditions, videos, and video signals by controlling the on and off of LEDs. LED display screen is also called electronic display screen or floating text screen. The content can be changed at any time, and each component is a display device with modular structure. It is usually composed of display module, control system and power supply system. The display module is composed of a dot matrix composed of LED lights, which is responsible for luminous display; the control system can display text, pictures, videos, etc. on the screen by controlling the on and off of the corresponding area; the power supply system is responsible for converting the input voltage and current into the voltage and current required by the display screen. LED display screen can display changing numbers, text, graphics, images, and videos; it can be used not only in indoor environments but also in outdoor environments, and has advantages that projectors, TV walls, and LCD screens cannot match.

LED display screens are generally formed by splicing together multiple smaller independent LED display modules. Each independent display module can work independently or be spliced together to work in combination. Usually, the LED display screen system is formed by multiple LED display modules through a mounting rack to form a large LED display screen. Because LED display screen systems are often used outdoors or in public places, for safety reasons, the mounting rack part is usually hidden and fixed, which often involves the front disassembly and maintenance of LED display modules, that is, taking out the LED display module from the front side of the LED display screen and performing maintenance. The existing front disassembly device of the LED display module generally absorbs the LED display module through a magnet assembly, thereby enabling the disassembly of the LED display module. The existing front disassembly device of the LED display module has a complex structure, and the magnetic suction method is prone to failure over time, resulting in an inability to unlock. Therefore, it is necessary to further improve the existing front disassembly device of the LED display module.

BRIEF SUMMARY

A technical problem to be solved by the present invention is to provide a fast-locking structure of LED display module and its disassembly method, aiming to provide a front disassembly device of an LED display screen which has a simple structure, stable performance and is easy to disassemble and assemble.

In order to solve the above technical problem, the technical solution of the present invention is as follows:

The first aspect of the present invention provides a fast-locking structure for LED display module, including a locking base, on which a locking shaft and a locking member are arranged through a locking groove, and an unlocking shaft is arranged on the locking shaft through a matching groove, and the unlocking shaft switches the sliding state of the locking shaft in the locking groove through a limiting end head and a slide groove hole in the matching groove, one end of the locking shaft is connected to drive the locking member, and a locking compression spring is arranged between the other end and the locking base, and the limiting end head is arranged at one end of the unlocking shaft, and an unlocking compression spring is arranged between the other end and the locking base.

Specifically, the locking base is arranged on a base plate, and the base plate is provided with a plurality of fixing holes, through which the fast-locking structure of LED display module is installed on the back plate of the LED display module.

Further, the locking member is composed of a sliding portion and a snap lock tongue arranged at one end of the sliding portion, and the other side of the sliding portion is connected to the driving end of one end of the locking shaft through a connecting groove.

Further, the snap lock tongue of the locking member extends from one side of the locking groove, and the locking shaft is installed on the other side of the locking groove through a locking shaft hole. The central axis direction of the locking shaft is the same as the telescopic direction of the snap lock tongue in the locking groove.

Further, the locking shaft member includes a mating groove arranged in the locking groove, a driving end is arranged at one end of the mating groove, and a locking threaded portion is arranged after the other end passes through the locking shaft hole, a locking end is installed on the locking threaded portion, and the locking compression spring is arranged between the locking end and the locking base.

Further, a slide slot hole is provided in the mating groove, and the slide slot hole consists of an unlocking hole portion and a locking sliding portion which are sequentially connected along the telescopic direction of the locking member, and the limiting end portion of the unlocking shaft member passes through the unlocking hole portion along a direction perpendicular to the telescopic direction of the locking member.

Further, the limiting end head is arranged at one end of the unlocking shaft, and an unlocking threaded portion is arranged at the other end after passing through the unlocking shaft hole on the locking groove, the unlocking end head is installed on the unlocking threaded portion, and the unlocking compression spring is arranged between the inner wall of the locking groove and the limiting end head.

Further, along a direction perpendicular to the extension and retraction direction of the locking piece, one side of the inner wall of the locking groove is provided with the unlocking shaft hole, and the other side is provided with a front unlocking hole corresponding to the limiting end head.

When in use, at least one set of fast-locking structures is installed on the back plate of the LED display module along the horizontal and vertical directions. The buckle lock tongue of the locking piece in the fast-locking structure initially extends out, and a buckle gap is formed between the buckle lock tongue and the back plate. The limit end head of the unlocking shaft cooperates with the unlocking hole in the slide slot to limit the movement of the locking shaft in the locking slot. The mounting rack unit includes a mounting frame and a mounting station plate arranged on the second side of the mounting frame. The mounting station plate is provided with a buckle matching plate corresponding to the buckle lock tongue of the locking piece. The buckle lock tongue is inclined relative to the buckle matching plate. On the basis of elastic deformation, the LED display module with a fast-locking structure is pushed and buckled on the mounting rack unit by pressing; when unlocking is required, the unlocking end can be toggled to make the limiting end head of the unlocking shaft leave the unlocking hole portion in the slide slot hole, and under the action of the locking compression spring, the locking shaft drives the locking member to contract, thereby unlocking and removing the LED display module from the mounting rack unit; at the same time, the unlocking shaft can also be pushed from the front unlocking hole to make the limiting end head of the unlocking shaft leave the unlocking hole portion in the slide slot hole to achieve front unlocking.

The second aspect of the present invention provides a method for quickly disassembling and assembling an LED display module based on the above-mentioned fast-locking structure of LED display module, comprising:

At least one set of fast-locking structures is installed on the back plate of the LED display module in the horizontal and vertical directions, the buckle lock tongue of the locking member in the fast-locking structure is initially extended, and the LED display module is buckled in the mounting rack unit by pushing from the front;

The unlocking shaft is pushed from the unlocking micro-hole arranged on the front side of the LED display module by the unlocking needle rod, so that the limiting end head of the unlocking shaft moves away from the unlocking hole in the slide slot hole and is unlocked from the mounting rack unit.

Further, the Method for quickly disassembling and assembling an LED display module also includes:

An unlocking guide instruction is sent to the LED display module, and a plurality of LED lamp beads surrounding the unlocking micro-hole on the LED panel of the LED display module are lit or flashed to mark the position of the unlocking micro-hole.

With the above-mentioned technical solution, the fast-locking structure of LED display module and its disassembly and assembly method thereof of the embodiment of the present invention adopt a snap lock tongue and a snap fitting plate, and a pushing method under the action of elastic deformation realizes the quick installation of the LED display module on the mounting rack unit. By switching and cooperating between the compression spring between the locking shaft and the unlocking shaft, and the limit end head and the slide slot hole, the unlocking needle rod can push the unlocking shaft from the unlocking microhole set on the front of the LED display module to realize quick unlocking from the front. The structure is ingenious and simple, the performance is stable, and it is easy to disassemble and assemble.

BRIEF DESCRIPTION OF THE DRAWINGS

In order to explain the technical solutions in the embodiments or the prior art of the present invention more clearly, a brief description will be given below with reference to the accompanying drawings which are used in the description of the embodiments or the prior art, and it is obvious that the drawings in the description below are merely some embodiments of the present invention, and it would have been obvious for a person skilled in the art to obtain other drawings according to these drawings without involving any inventive effort.

Figure 1:
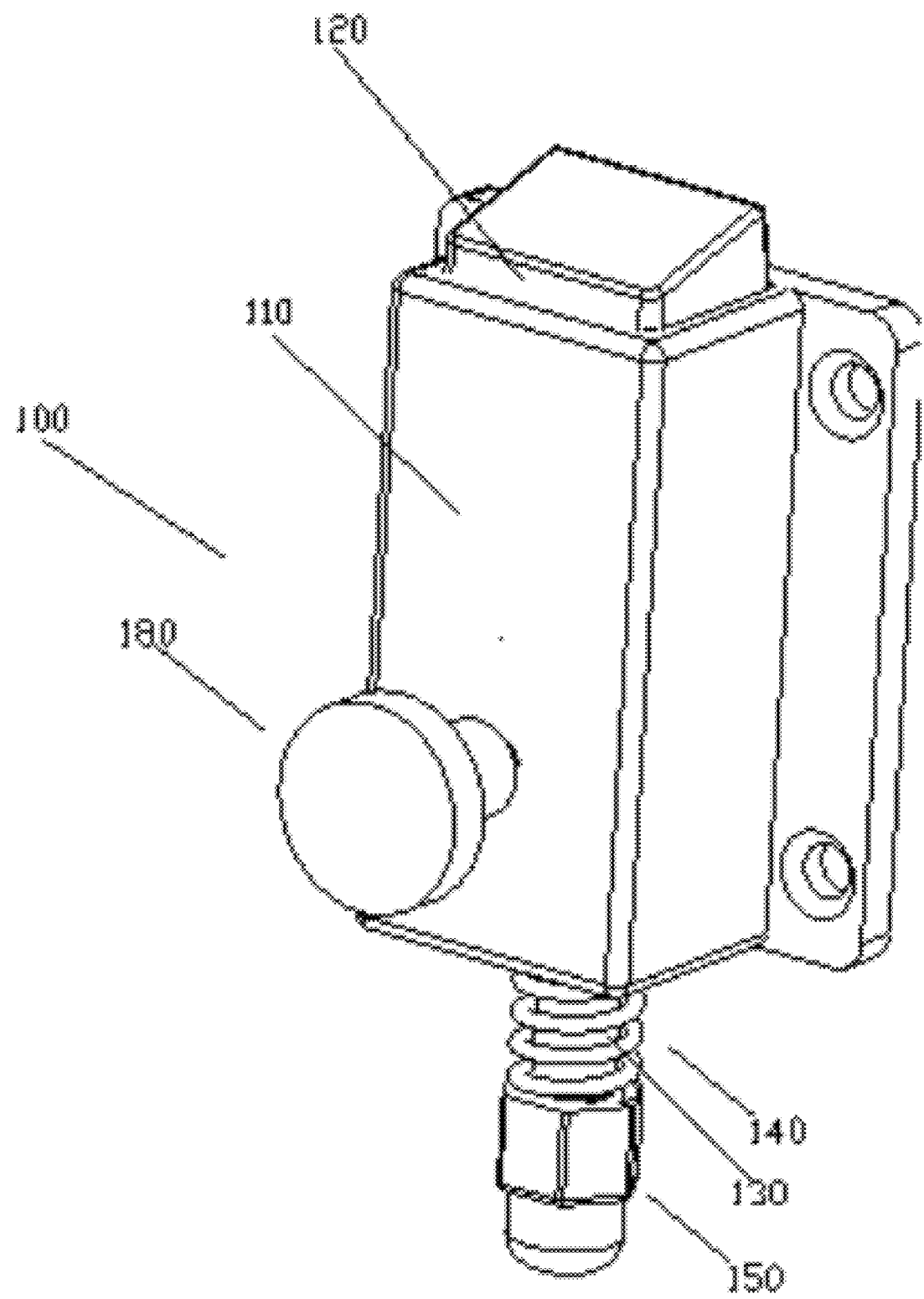
FIG. 1 is a three-dimensional structural diagram of a fast-locking structure of an LED display module according to an embodiment of the present invention.

In the figure, 100—fast-locking structure, 110—locking base, 120—locking member, 130—locking shaft, 140—locking compression spring, 150—locking end, 160—unlocking shaft, 170—unlocking compression spring, 180—unlocking end;

111—locking groove, 112—base plate, 113—fixing hole, 114—unlocking shaft hole, 115—front unlocking hole, 116—locking shaft hole;

121—buckle lock tongue, 122—connecting slot, 123—sliding part;

131—matching groove, 132—slide hole, 1321—unlocking hole portion, 1322—locking sliding portion, 133—driving end head, 134—locking threaded portion;

161—limiting end portion, 162—unlocking thread portion;

200—LED display module, 210—LED panel, 211—LED lamp beads, 212—unlocking micro hole;

300—mounting rack unit, 310—mounting frame, 320—mounting station plate, 321—snap-fit plate;

400—Unlock the needle bar.

DETAILED DESCRIPTION OF THE DRAWINGS AND THE PRESENTLY PREFERRED EMBODIMENTS

Reference will now be made in detail to the embodiments of the present invention, examples of which are illustrated in the accompanying drawings. It is to be understood that the description of these embodiments is intended to aid in the understanding of the present invention, and is not intended to limit the scope of the present invention. Further, the technical features involved in the various embodiments of the present invention described below can be combined with each other as long as they do not conflict with each other.

Embodiment 1

As shown in FIGS. 1-6, an embodiment of the present invention provides a fast-locking structure 100 for an LED display module, including a locking base 110, on which a locking shaft 130 and a locking member 120 are arranged through a locking groove 111, and an unlocking shaft 160 is arranged on the locking shaft 130 through a matching groove 131. The unlocking shaft 160 switches the sliding state of the locking shaft 130 in the locking groove 131 through a limiting end head 161 and a slide groove hole 132 in the matching groove 131. One end of the locking shaft 130 is connected to drive the locking member 120, and a locking compression spring 140 is arranged between the other end and the locking base 110. The limiting end head 161 is arranged at one end of the unlocking shaft 160, and an unlocking compression spring 170 is arranged between the other end and the locking base 110.

Specifically, the locking base 110 is disposed on a base plate 112, and a plurality of fixing holes 113 are disposed on the base plate 112. The Fast-locking structure of LED display module 100 is installed on the back plate of the LED display module 200 through the fixing holes 113.

Figure 2:
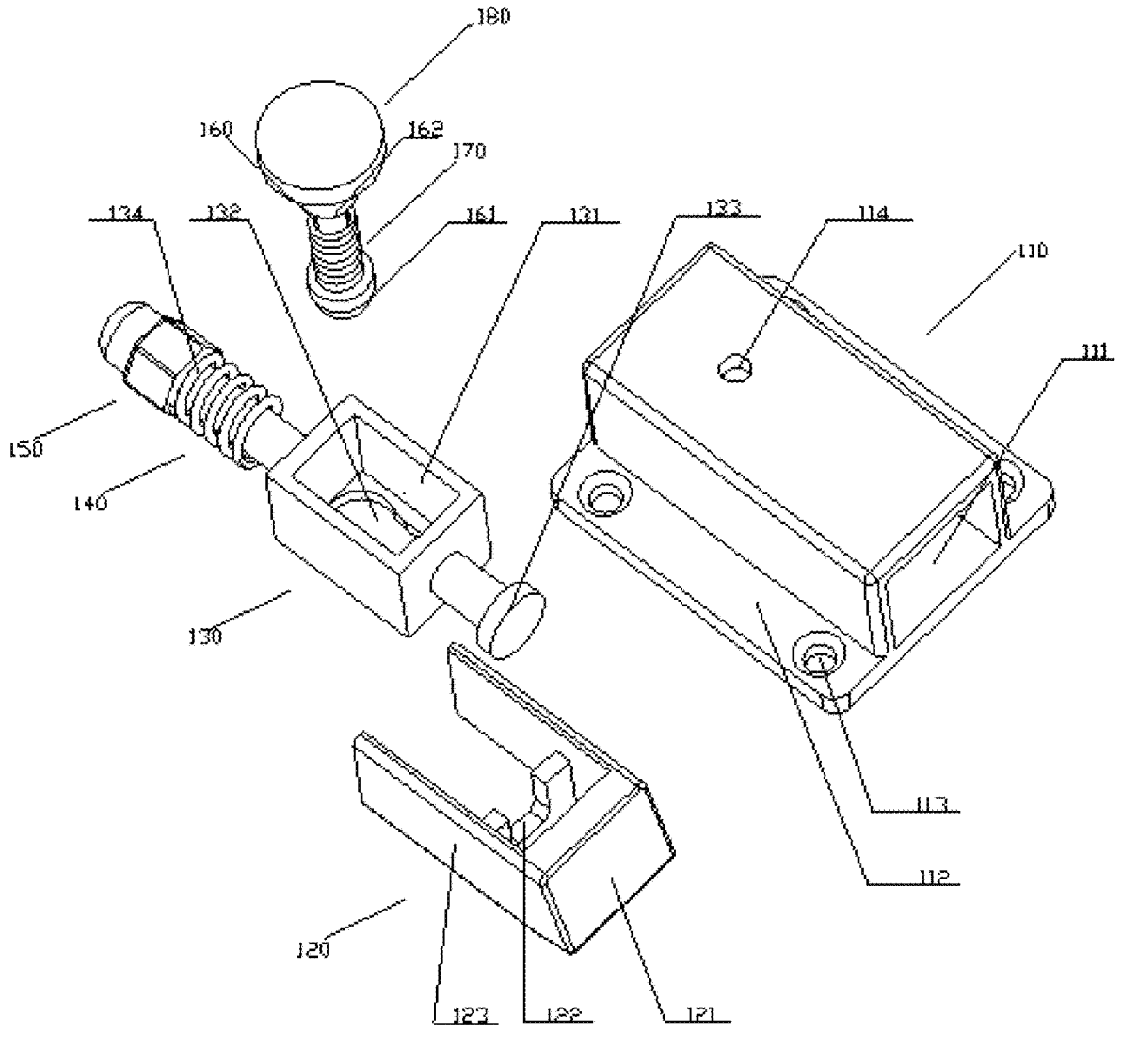
FIG. 2 is a three-dimensional exploded structural diagram of a fast-locking structure of an LED display module according to an embodiment of the present invention.
Figure 3:
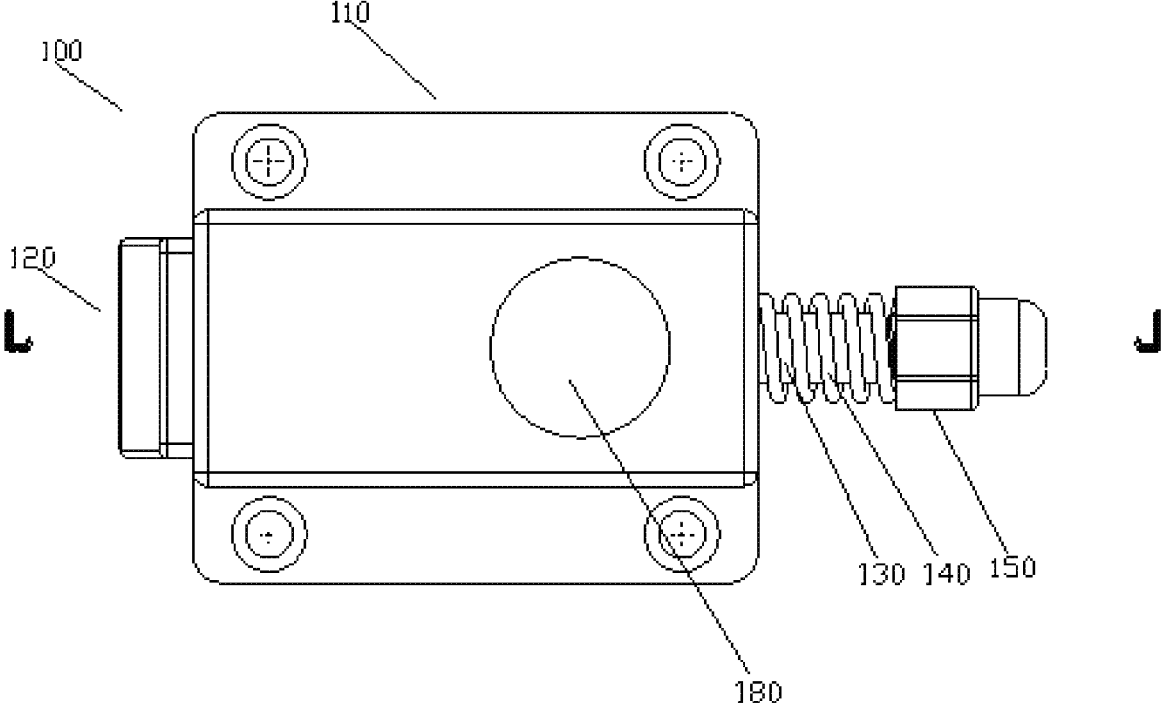
FIG. 3 is a top view of a fast-locking structure of an LED display module provided by an embodiment of the present invention.
Figure 4:
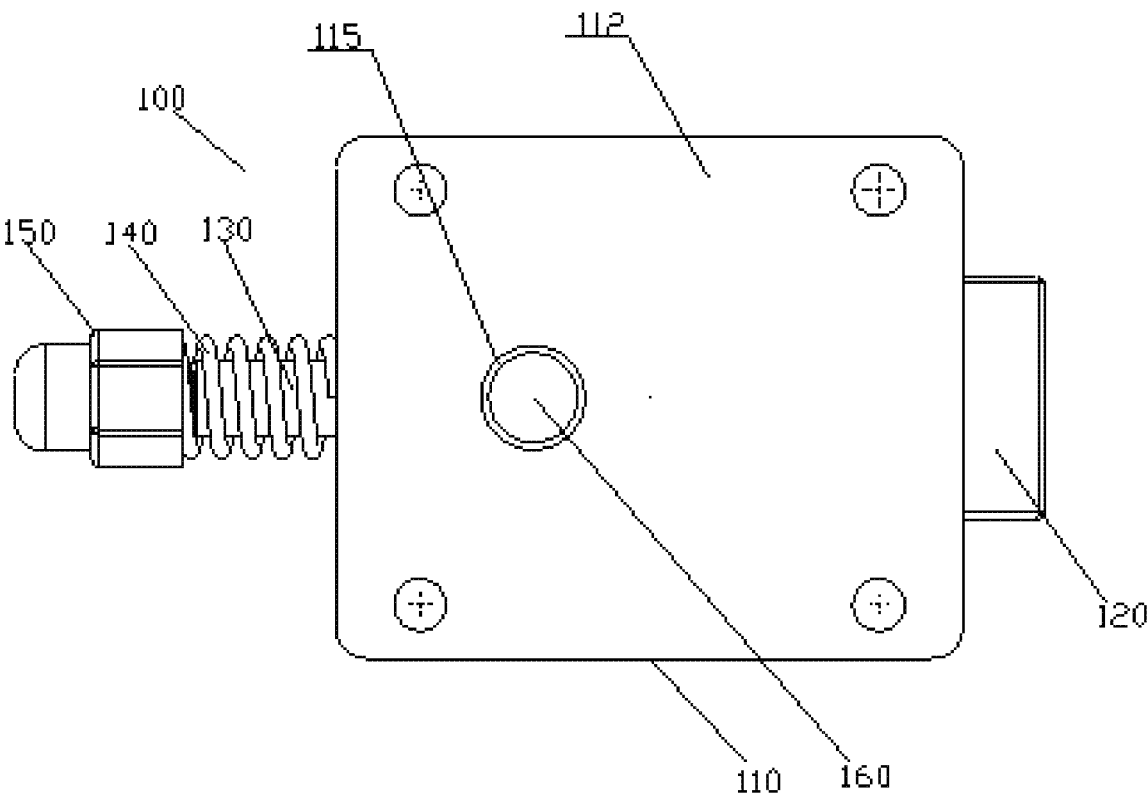
FIG. 4 is a bottom view of a fast-locking structure of an LED display module provided by an embodiment of the present invention.
Figure 5:
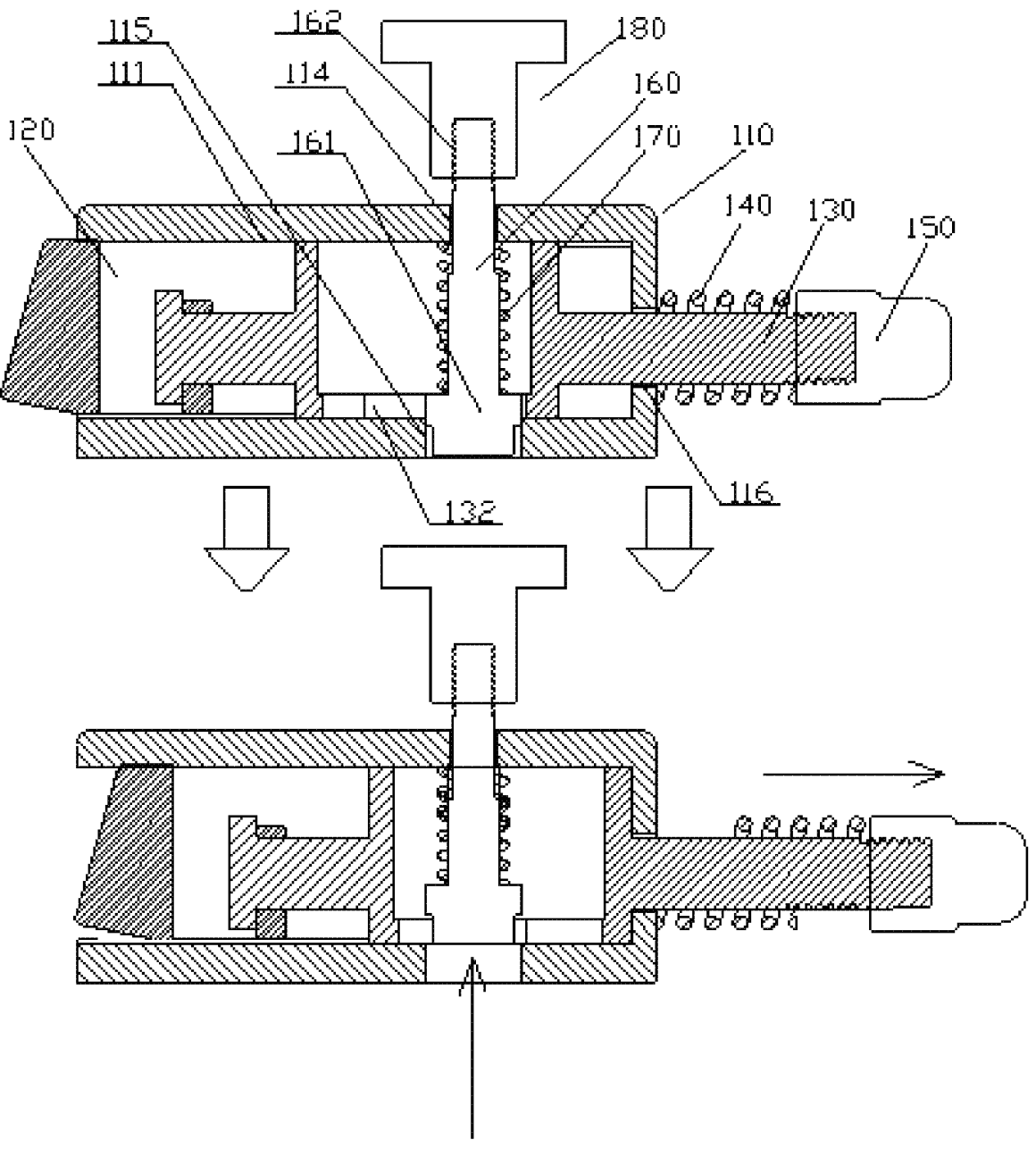
FIG. 5 is a cross-sectional structural diagram along A-A in an unlocked state.
Figure 6:
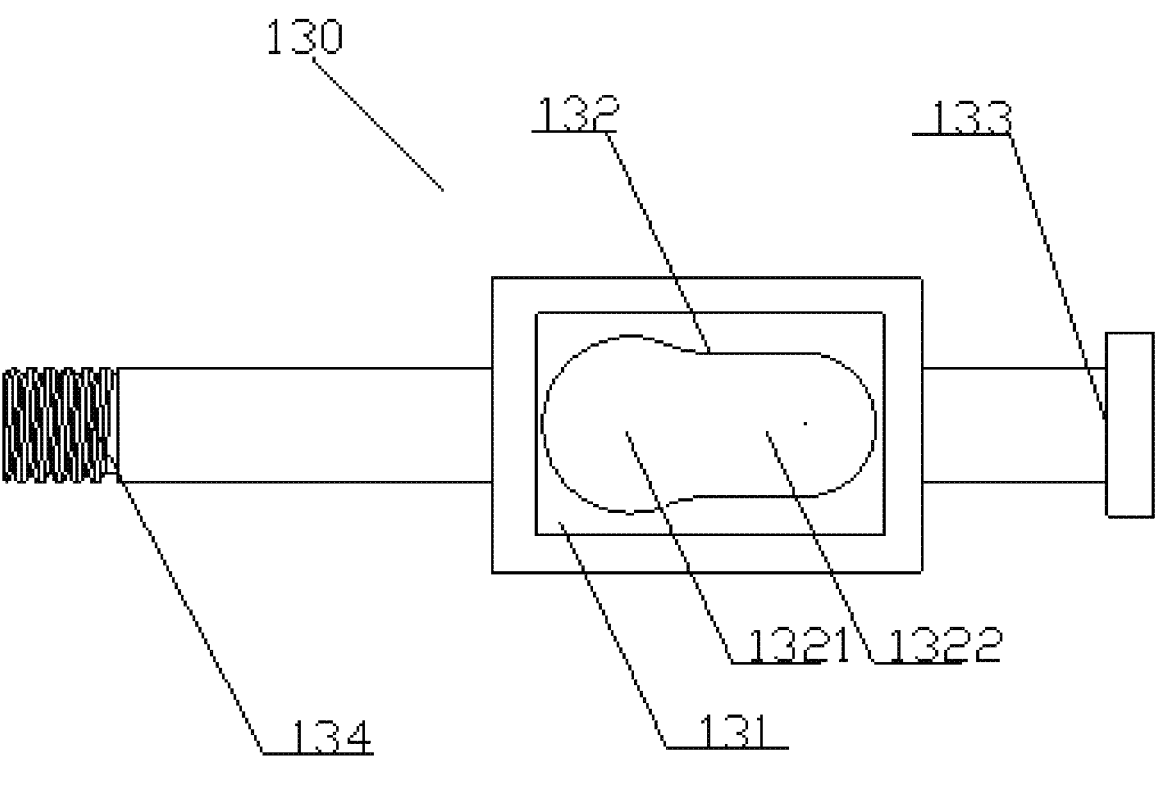
FIG. 6 is a top view of the locking shaft provided in an embodiment of the present invention.

As shown in FIGS. 2, 5 and 6, the locking member 120 consists of a sliding portion 123 and a snap lock tongue 121 arranged at one end of the sliding portion 123. The other side of the sliding portion 123 is connected to the driving end 133 at one end of the locking shaft 130 through a connecting slot 122.

Among them, the snap lock tongue 121 of the locking member 120 extends from one side of the locking groove 111, and the locking shaft member 130 is installed on the other side of the locking groove 111 through a locking shaft hole 116. The central axis direction of the locking shaft member 130 is the same as the telescopic direction of the snap lock tongue 121 in the locking groove 111.

As shown in FIG. 6, the locking shaft 130 includes a matching groove 131 arranged in the locking groove 111, a driving end 133 is arranged at one end of the matching groove 131, and a locking threaded portion 134 is arranged after passing through the locking shaft hole 116 at the other end, a locking end 150 is installed on the locking threaded portion 134, and the locking compression spring 140 is arranged between the locking end 150 and the locking base 110.

As shown in FIGS. 2 and 5, a slide hole 132 is provided in the matching groove 131, and the slide hole 132 is composed of an unlocking hole portion 1321 and a locking sliding portion 1322 which are sequentially connected along the extension direction of the locking member 120, and the limiting end portion 161 of the unlocking shaft member 160 penetrates the unlocking hole portion 1321 along a direction perpendicular to the extension direction of the locking member 120. Optionally, the limiting end portion 161 is provided at one end of the unlocking shaft member 160, and the unlocking threaded portion 162 is provided at the other end after penetrating the unlocking shaft hole 114 on the locking groove 111, and the unlocking end portion 180 is installed on the unlocking threaded portion 162, and the unlocking compression spring 170 is provided between the inner wall of the locking groove 111 and the limiting end portion 161.

Among them, along the direction perpendicular to the extension and retraction direction of the locking member 120, one side of the inner wall of the locking groove 111 is provided with the unlocking shaft hole 114, and the other side is provided with a front unlocking hole 115 corresponding to the limiting end head 161.

Figure 7:
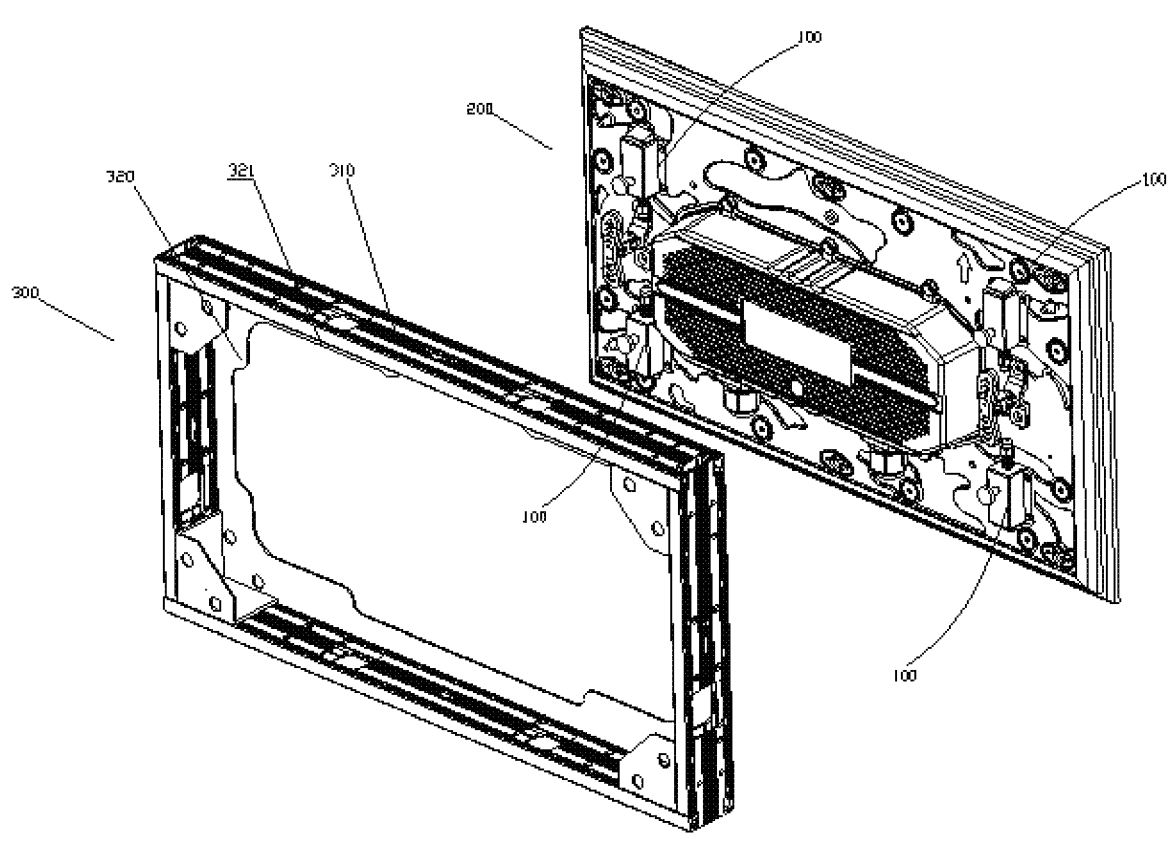
FIG. 7 is a three-dimensional exploded structural diagram of the Fast-locking structure of LED display module provided by an embodiment of the present invention in an installed state.
Figure 8:
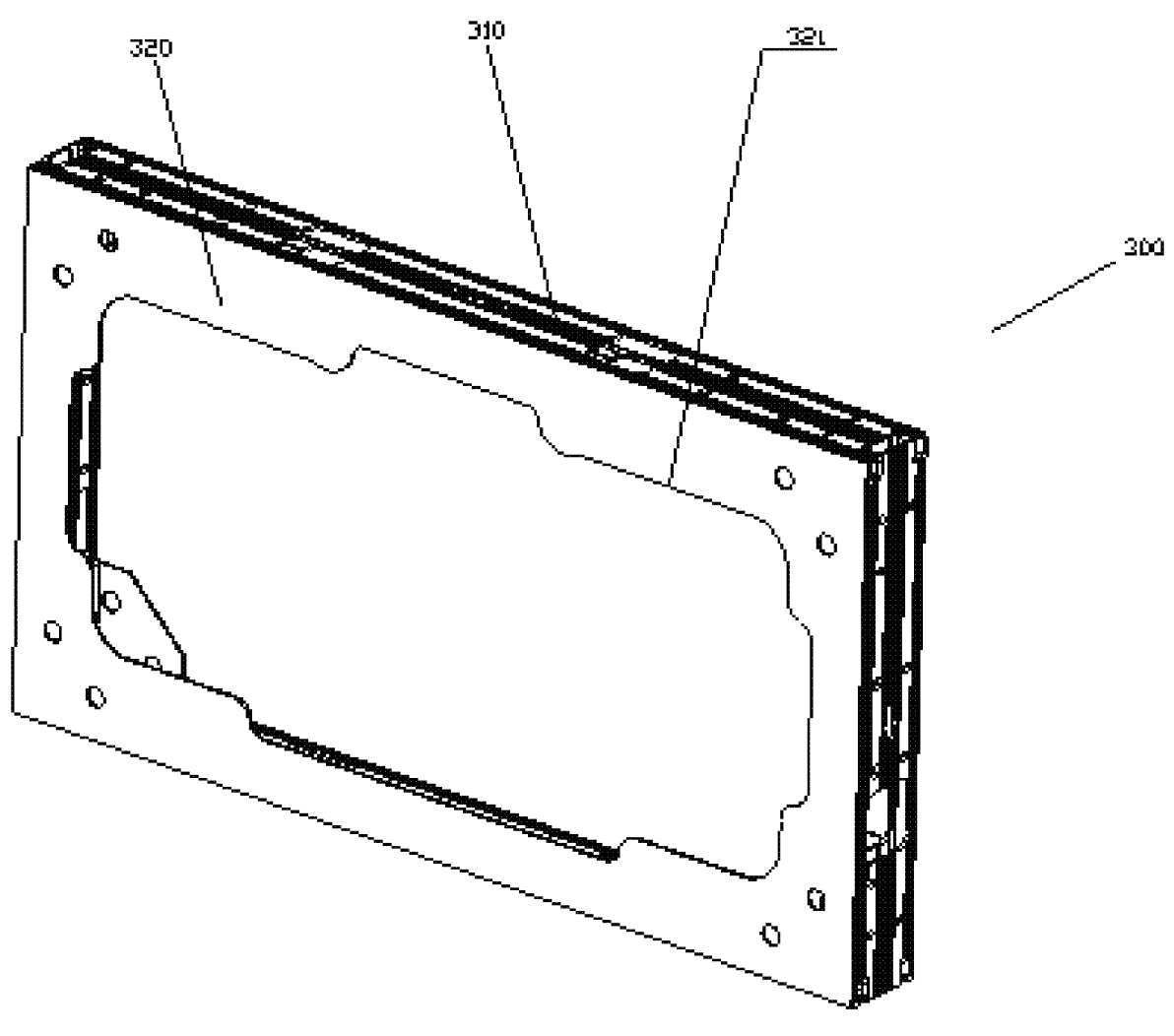
FIG. 8 is a three-dimensional structural diagram of a mounting rack unit provided by an embodiment of the present invention.

As shown in FIGS. 7 and 8, when in use, at least one group of fast-locking structures 100 is installed on the back plate of the LED display module 200 along the horizontal and vertical directions. The buckle lock tongue 121 of the locking member 120 in the fast-locking structure 100 initially extends out, and a buckle gap is formed between the buckle lock tongue 121 and the back plate. The limiting end head 161 of the unlocking shaft member 160 cooperates with the unlocking hole portion 1321 in the slide slot hole 132 to limit the locking shaft member 130 from moving in the locking groove 111. The mounting rack unit 300 includes a mounting frame 310 and a mounting station plate 320 arranged on one side of the mounting frame 310. The mounting station plate 320 is provided with a buckle matching plate 321 corresponding to the buckle lock tongue 121 of the locking member 120. The buckle lock tongue 121 is inclined relative to the buckle matching plate 321, so that the buckle lock tongue 121 is elastically deformed. On the basis, the LED display module 200 with the fast-locking structure 100 is pushed and buckled on the mounting rack unit 300 by pressing; when unlocking is required, the unlocking end head 180 can be toggled to make the limiting end head 161 of the unlocking shaft member 160 leave the unlocking hole portion 1321 in the slide slot hole 132, and under the action of the locking compression spring 140, the unlocking shaft member 160 slides on the locking sliding portion 1322 in the slide slot hole 132, and the locking shaft member 130 drives the locking member 120 to contract, thereby unlocking and removing the LED display module 200 from the mounting rack unit 300; at the same time, the unlocking shaft member 160 can also be pushed from the front unlocking hole 115, so that the limiting end head 161 of the unlocking shaft member 160 leaves the unlocking hole portion 1321 in the slide slot hole 132, thereby realizing front unlocking.

Embodiment 2

Figure 9:
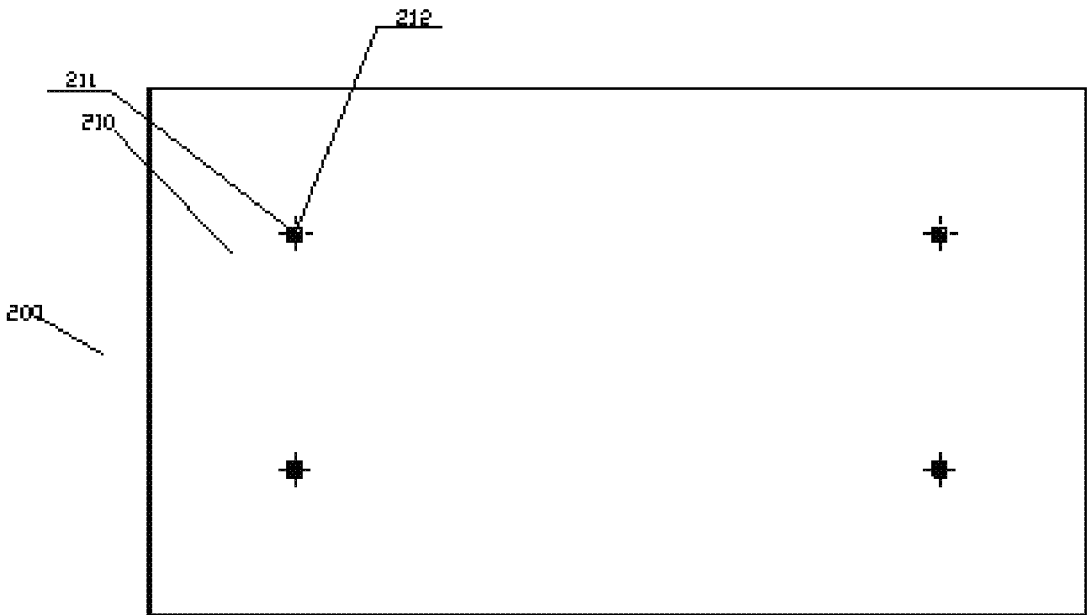
FIG. 9 is a side structural diagram of the unlocking process of the fast-locking structure of LED display module provided by an embodiment of the present invention.
Figure 9:
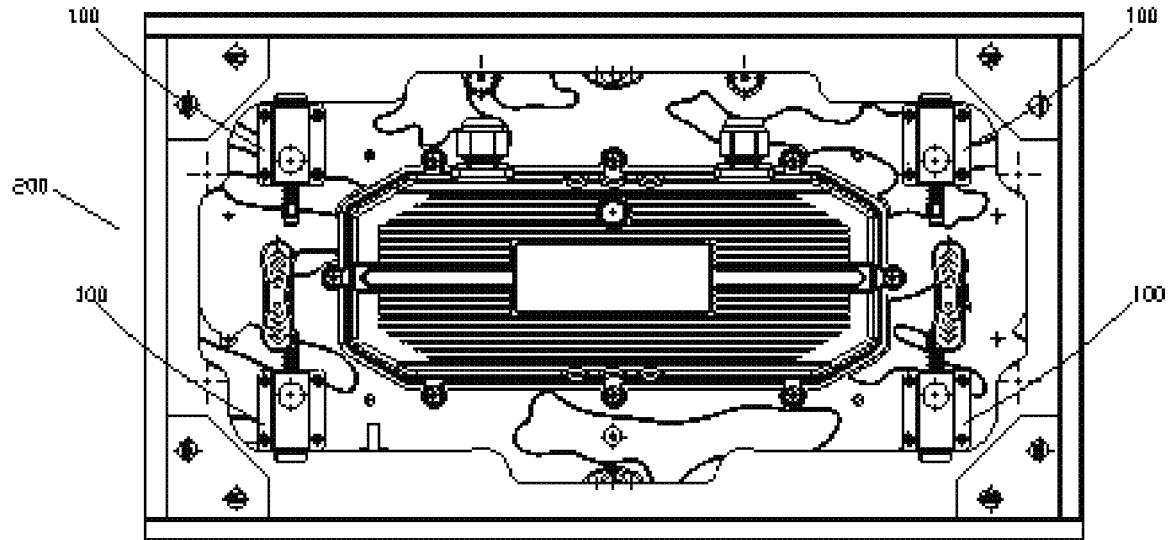
Figure 10:
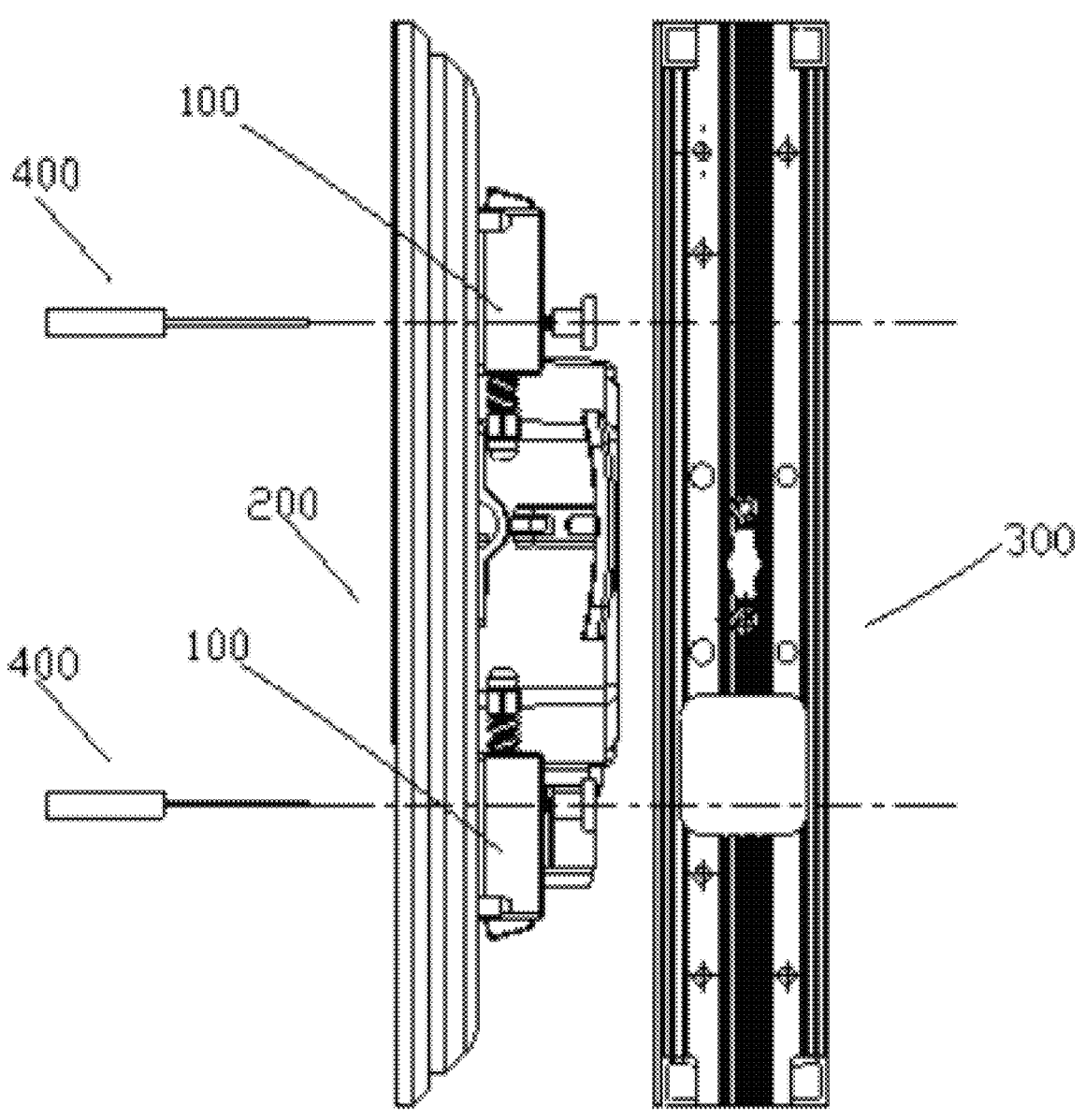
FIG. 10 is a front view structural diagram of the unlocking guide of the fast-locking structure of LED display module provided by an embodiment of the present invention.

As shown in FIGS. 9 and 10, an embodiment of the present invention provides a method for quickly disassembling and assembling an LED display module based on the above-mentioned fast-locking structure of LED display module, the method comprising:

At least one set of fast-locking structures 100 is installed on the back plate of the LED display module 200 along the horizontal and vertical directions, and the buckle lock tongue 121 of the locking member 120 in the fast-locking structure 100 is initially extended, and the LED display module 200 is buckled on the mounting rack unit 300 by pushing from the front;

The unlocking pin rod 400 pushes the unlocking shaft 160 from the unlocking micro hole 212 set on the front side of the LED display module 200, so that the limiting end head 161 of the unlocking shaft 160 leaves the unlocking hole 1321 in the slide slot hole 132 and is unlocked from the mounting rack unit 300.

Specifically, the Method for quickly disassembling and assembling an LED display module also includes:

An unlocking guide instruction is sent to the LED display module 200, and a plurality of LED lamp beads 211 surrounding the unlocking micro-hole 212 on the LED panel 210 of the LED display module 200 are lit or flashed to mark the position of the unlocking micro-hole 212.

The Fast-locking structure of LED display module and its disassembly and assembly method of the embodiment of the present invention adopts a snap lock tongue and a snap matching plate, and a pushing method under the action of elastic deformation realizes the quick installation of the LED display module on the mounting rack unit. Through the switching cooperation between the compression spring between the locking shaft and the unlocking shaft, the limit end head and the slide slot hole, the unlocking needle rod can push the unlocking shaft from the unlocking microhole set on the front of the LED display module to realize quick unlocking from the front. The structure is ingenious and simple, the performance is stable, and it is easy to disassemble and assemble.

The invention claimed is:

1. A fast-locking structure for LED display module, comprising:

a locking base, a locking shaft and a locking member, being arranged on the locking base through a locking groove, an unlocking shaft is arranged on the locking shaft through a matching groove, the unlocking shaft switches the sliding state of the locking shaft in the locking groove through a limiting end head and a slide slot hole in the matching groove, wherein one end of the locking shaft is connected to drive the locking member, and a locking compression spring is arranged between the other end of the locking shaft and the locking base, a limiting end head is arranged at one end of the unlocking shaft, and an unlocking compression spring is arranged between the other end and the locking base, wherein the locking piece consists of a sliding part and a snap lock tongue arranged at one end of the sliding part, and the other side of the sliding part is connected to the driving end of one end of the locking shaft through a connecting slot, wherein the snap lock tongue of the locking member extends from one side of the locking groove, and the locking shaft is installed on the other side of the locking groove through a locking shaft hole, and the central axis direction of the locking shaft is the same as the telescopic direction of the snap lock tongue in the locking groove, wherein the locking shaft includes a matching groove arranged in the locking groove, a driving end is arranged at one end of the matching groove, and a locking threaded portion is arranged after the other end passes through the locking shaft hole, a locking end is installed on the locking threaded portion, and a locking compression spring is arranged between the locking end and the locking base.

2. The fast-locking structure of LED display module according to claim 1, wherein the locking base is arranged on a base plate, and the base plate is provided with a plurality of fixing holes, and the fast-locking structure of LED display module is installed on a back plate of the LED display module through the fixing holes.

3. The fast-locking structure of LED display module according to claim 1, wherein a slide slot hole is arranged in the matching groove, and the slide slot hole is composed of an unlocking hole portion and a locking sliding portion which are sequentially connected along the telescopic direction of the locking member, and the limiting end head of the unlocking shaft member passes through the unlocking hole portion along a direction perpendicular to the telescopic direction of the locking member.

4. The fast-locking structure of LED display module according to claim 3, wherein the limiting end head is arranged at one end of the unlocking shaft, and an unlocking threaded portion is arranged at the other end after passing through the unlocking shaft hole on the locking groove, an unlocking end head is installed on the unlocking threaded portion, and an unlocking compression spring is arranged between the inner wall of the locking groove and the limiting end head.

5. The fast-locking structure of LED display module according to claim 4, wherein, along a direction perpendicular to the telescopic direction of the locking piece, an unlocking shaft hole is provided on one side of the inner wall of the locking groove, and a front unlocking hole is provided on the other side corresponding to the limiting end head.

* * * * *